United States Patent
Fitzpatrick et al.

(10) Patent No.: US 9,214,965 B2
(45) Date of Patent: Dec. 15, 2015

(54) METHOD AND SYSTEM FOR IMPROVING DATA INTEGRITY IN NON-VOLATILE STORAGE

(71) Applicant: SanDisk Enterprise IP LLC, Dallas, TX (US)

(72) Inventors: James Fitzpatrick, Sudbury, MA (US); Amirhossein Rafati, Somerville, MA (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 140 days.

(21) Appl. No.: 14/076,115

(22) Filed: Nov. 8, 2013

(65) Prior Publication Data

US 2014/0237315 A1 Aug. 21, 2014

Related U.S. Application Data

(60) Provisional application No. 61/767,234, filed on Feb. 20, 2013.

(51) Int. Cl.
*H03M 13/00* (2006.01)
*H03M 13/29* (2006.01)
*G06F 11/10* (2006.01)

(52) U.S. Cl.
CPC ....... *H03M 13/2909* (2013.01); *G06F 11/1012* (2013.01)

(58) Field of Classification Search
None
See application file for complete search history.

(56) References Cited

U.S. PATENT DOCUMENTS

| | | | |
|---|---|---|---|
| 4,048,481 A | 9/1977 | Bailey, Jr. et al. |
| 4,839,587 A | 6/1989 | Flatley et al. |
| 4,916,652 A | 4/1990 | Schwarz et al. |
| 5,034,744 A | 7/1991 | Obinata |
| 5,210,854 A | 5/1993 | Beaverton et al. |
| 5,311,395 A | 5/1994 | McGaha et al. |
| 5,450,354 A | 9/1995 | Sawada et al. |
| 5,479,638 A | 12/1995 | Assar et al. |
| 5,519,847 A | 5/1996 | Fandrich et al. |
| 5,530,705 A | 6/1996 | Malone |

(Continued)

FOREIGN PATENT DOCUMENTS

| | | | |
|---|---|---|---|
| EP | 1465203 A1 | 10/2004 |
| EP | 1 956 489 A2 | 8/2008 |

(Continued)

OTHER PUBLICATIONS

International Search Report and Written Opinion dated Nov. 7, 2014, received in International Patent Application No. PCT/US2014/049732, which corresponds to U.S. Appl. No. 14/334,350, 13 pages (Fitzpatrick).

(Continued)

*Primary Examiner* — April Y Blair
*Assistant Examiner* — Thien D Nguyen
(74) *Attorney, Agent, or Firm* — Morgan, Lewis & Bockius LLP

(57) ABSTRACT

A method for improving data integrity in a non-volatile memory system includes: accessing a non-volatile memory cell for retrieving hard data bits; generating soft information by capturing a reliability of the hard data bits; calculating syndrome bits by applying a lossy compression to the soft information; and generating a host data by executing a low density parity check (LDPC) iterative decode on the hard data bits and the syndrome bits.

15 Claims, 6 Drawing Sheets

(56) References Cited

U.S. PATENT DOCUMENTS

| | | |
|---|---|---|
| 5,537,555 A | 7/1996 | Landry |
| 5,551,003 A | 8/1996 | Mattson et al. |
| 5,657,332 A | 8/1997 | Auclair et al. |
| 5,666,114 A | 9/1997 | Brodie et al. |
| 5,708,849 A | 1/1998 | Coke et al. |
| 5,784,174 A | 7/1998 | Fujino et al. |
| 5,790,828 A | 8/1998 | Jost |
| 5,930,504 A | 7/1999 | Gabel |
| 5,943,692 A | 8/1999 | Marberg et al. |
| 5,949,785 A | 9/1999 | Beasley |
| 5,963,893 A | 10/1999 | Sakakura et al. |
| 5,982,664 A | 11/1999 | Watanabe |
| 6,000,006 A | 12/1999 | Bruce et al. |
| 6,016,560 A | 1/2000 | Wada et al. |
| 6,018,304 A | 1/2000 | Bessios |
| 6,034,897 A | 3/2000 | Estakhri et al. |
| 6,069,827 A | 5/2000 | Sinclair |
| 6,070,074 A | 5/2000 | Perahia et al. |
| 6,091,652 A | 7/2000 | Haehn et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,275,436 B1 | 8/2001 | Tobita et al. |
| 6,295,592 B1 | 9/2001 | Jeddeloh et al. |
| 6,311,263 B1 | 10/2001 | Barlow et al. |
| 6,345,367 B1 | 2/2002 | Sinclair |
| 6,356,447 B2 | 3/2002 | Scafidi |
| 6,381,670 B1 | 4/2002 | Lee et al. |
| 6,412,080 B1 | 6/2002 | Fleming et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,529,997 B1 | 3/2003 | Debiez et al. |
| 6,552,581 B1 | 4/2003 | Gabara |
| 6,587,915 B1 | 7/2003 | Kim |
| 6,618,249 B2 | 9/2003 | Fairchild |
| 6,661,503 B1 | 12/2003 | Yamaguchi et al. |
| 6,678,788 B1 | 1/2004 | O'Connell |
| 6,728,913 B1 | 4/2004 | Parker |
| 6,757,768 B1 | 6/2004 | Potter et al. |
| 6,763,424 B2 | 7/2004 | Conley |
| 6,775,792 B2 | 8/2004 | Ulrich et al. |
| 6,778,387 B2 | 8/2004 | Fairchild |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,850,443 B2 | 2/2005 | Lofgren et al. |
| 6,854,070 B2 | 2/2005 | Johnson et al. |
| 6,871,257 B2 | 3/2005 | Conley et al. |
| 6,871,304 B2 | 3/2005 | Hadjihassan et al. |
| 6,895,464 B2 | 5/2005 | Chow et al. |
| 6,903,972 B2 | 6/2005 | Lasser et al. |
| 6,906,961 B2 | 6/2005 | Eggleston et al. |
| 6,975,028 B1 | 12/2005 | Wayburn et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,032,123 B2 | 4/2006 | Kane et al. |
| 7,043,505 B1 | 5/2006 | Teague et al. |
| 7,082,495 B2 | 7/2006 | DeWhitt et al. |
| 7,100,002 B2 | 8/2006 | Shrader et al. |
| 7,107,389 B2 | 9/2006 | Inagaki et al. |
| 7,111,293 B1 | 9/2006 | Hersh et al. |
| 7,139,864 B2 | 11/2006 | Bennett et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,233,497 B2 | 6/2007 | Simon et al. |
| 7,243,186 B2 | 7/2007 | Liang et al. |
| 7,298,888 B2 | 11/2007 | Hamar |
| 7,328,377 B1 | 2/2008 | Lewis et al. |
| 7,330,927 B1 | 2/2008 | Reeve et al. |
| 7,333,364 B2 | 2/2008 | Yu et al. |
| 7,350,101 B1 | 3/2008 | Nguyen et al. |
| 7,355,896 B2 | 4/2008 | Li et al. |
| 7,434,122 B2 | 10/2008 | Jo |
| 7,441,067 B2 | 10/2008 | Gorobets et al. |
| 7,516,267 B2 | 4/2009 | Coulson et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,571,277 B2 | 8/2009 | Mizushima |
| 7,574,554 B2 | 8/2009 | Tanaka et al. |
| 7,596,643 B2 | 9/2009 | Merry et al. |
| 7,613,871 B2 | 11/2009 | Tanaka et al. |
| 7,620,710 B2 | 11/2009 | Kottomtharayil et al. |
| 7,620,769 B2 | 11/2009 | Lee et al. |
| 7,639,532 B2 | 12/2009 | Roohparvar et al. |
| 7,661,054 B2 | 2/2010 | Huffman et al. |
| 7,679,948 B2 | 3/2010 | Park et al. |
| 7,681,106 B2 | 3/2010 | Jarrar et al. |
| 7,685,494 B1 | 3/2010 | Varnica et al. |
| 7,693,422 B2 | 4/2010 | Alicherry et al. |
| 7,707,481 B2 | 4/2010 | Kirschner et al. |
| 7,738,502 B2 | 6/2010 | Chang et al. |
| 7,743,216 B2 | 6/2010 | Lubbers et al. |
| 7,761,655 B2 | 7/2010 | Mizushima et al. |
| 7,774,390 B2 | 8/2010 | Shin |
| 7,818,525 B1 | 10/2010 | Frost et al. |
| 7,827,348 B2 | 11/2010 | Lee et al. |
| 7,830,164 B2 | 11/2010 | Earle et al. |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich |
| 7,979,614 B1 | 7/2011 | Yang |
| 7,996,642 B1 | 8/2011 | Smith |
| 8,001,135 B2 | 8/2011 | Perlmutter et al. |
| 8,006,161 B2 | 8/2011 | Lestable et al. |
| 8,010,738 B1 | 8/2011 | Chilton et al. |
| 8,028,123 B2 | 9/2011 | Kilzer et al. |
| 8,032,724 B1 | 10/2011 | Smith |
| 8,046,645 B2 | 10/2011 | Hsu et al. |
| 8,051,241 B2 | 11/2011 | Feldman et al. |
| 8,055,979 B2 | 11/2011 | Wu et al. |
| 8,069,390 B2 | 11/2011 | Lin |
| 8,072,805 B2 | 12/2011 | Chou et al. |
| 8,095,724 B2 | 1/2012 | Ji et al. |
| 8,095,765 B2 | 1/2012 | Asnaashari et al. |
| 8,117,396 B1 | 2/2012 | Fair et al. |
| 8,127,202 B2 | 2/2012 | Cornwell et al. |
| 8,145,984 B2 | 3/2012 | Sommer et al. |
| 8,154,921 B2 | 4/2012 | Mokhlesi et al. |
| 8,169,825 B1 | 5/2012 | Shalvi et al. |
| 8,190,967 B2 | 5/2012 | Hong et al. |
| 8,205,028 B1 | 6/2012 | Sakarda |
| 8,209,677 B2 | 6/2012 | Shintani et al. |
| 8,219,724 B1 | 7/2012 | Caruso et al. |
| 8,219,776 B2 | 7/2012 | Forhan et al. |
| 8,228,701 B2 | 7/2012 | Sokolov et al. |
| 8,245,101 B2 | 8/2012 | Olbrich et al. |
| 8,250,621 B2 | 8/2012 | Cha |
| 8,254,172 B1 | 8/2012 | Kan |
| 8,254,181 B2 | 8/2012 | Hwang et al. |
| 8,259,506 B1 | 9/2012 | Sommer et al. |
| 8,289,801 B2 | 10/2012 | Smith et al. |
| 8,296,534 B1 | 10/2012 | Gupta et al. |
| 8,312,349 B2 | 11/2012 | Reche et al. |
| 8,332,578 B2 | 12/2012 | Frickey, III et al. |
| 8,363,413 B2 | 1/2013 | Paquette et al. |
| 8,369,141 B2 | 2/2013 | Sommer et al. |
| 8,386,700 B2 | 2/2013 | Olbrich et al. |
| 8,386,860 B2 | 2/2013 | Tseng et al. |

(56) References Cited

U.S. PATENT DOCUMENTS

| | | |
|---|---|---|
| 8,407,409 B2 | 3/2013 | Kawaguchi |
| 8,412,985 B1 | 4/2013 | Bowers et al. |
| 8,464,106 B2 | 6/2013 | Filor et al. |
| 8,503,238 B1 | 8/2013 | Wu et al. |
| 8,601,203 B2 | 12/2013 | Holbrook et al. |
| 8,612,669 B1 | 12/2013 | Syu et al. |
| 8,612,804 B1 | 12/2013 | Kang et al. |
| 8,661,184 B2 | 2/2014 | Wood et al. |
| 8,694,811 B2 | 4/2014 | Raju et al. |
| 8,832,506 B2 | 9/2014 | Griffin et al. |
| 8,984,216 B2 | 3/2015 | Fillingim |
| 2002/0024846 A1 | 2/2002 | Kawahara et al. |
| 2002/0056025 A1 | 5/2002 | Qiu et al. |
| 2002/0083299 A1 | 6/2002 | Van Huben et al. |
| 2002/0152305 A1 | 10/2002 | Jackson et al. |
| 2002/0156891 A1 | 10/2002 | Ulrich et al. |
| 2002/0159285 A1 | 10/2002 | Morley et al. |
| 2002/0162075 A1 | 10/2002 | Talagala et al. |
| 2002/0165896 A1 | 11/2002 | Kim |
| 2003/0033308 A1 | 2/2003 | Patel et al. |
| 2003/0041299 A1 | 2/2003 | Kanazawa et al. |
| 2003/0043829 A1 | 3/2003 | Rashid |
| 2003/0046603 A1 | 3/2003 | Harari et al. |
| 2003/0074592 A1 | 4/2003 | Hasegawa |
| 2003/0088805 A1 | 5/2003 | Majni et al. |
| 2003/0093628 A1 | 5/2003 | Matter et al. |
| 2003/0163633 A1 | 8/2003 | Aasheim et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0073829 A1 | 4/2004 | Olarig |
| 2004/0080985 A1 | 4/2004 | Chang et al. |
| 2004/0088511 A1 | 5/2004 | Bacon et al. |
| 2004/0153902 A1 | 8/2004 | Machado et al. |
| 2004/0181734 A1 | 9/2004 | Saliba |
| 2004/0199714 A1 | 10/2004 | Estakhri et al. |
| 2004/0237018 A1 | 11/2004 | Riley |
| 2004/0252670 A1 | 12/2004 | Rong et al. |
| 2005/0021904 A1 | 1/2005 | Iaculo et al. |
| 2005/0038792 A1 | 2/2005 | Johnson |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0076102 A1 | 4/2005 | Chen et al. |
| 2005/0114587 A1 | 5/2005 | Chou et al. |
| 2005/0144516 A1 | 6/2005 | Gonzalez et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0015683 A1 | 1/2006 | Ashmore et al. |
| 2006/0020745 A1 | 1/2006 | Conley et al. |
| 2006/0022054 A1 | 2/2006 | Elhamias et al. |
| 2006/0039196 A1 | 2/2006 | Gorobets et al. |
| 2006/0053246 A1 | 3/2006 | Lee |
| 2006/0080505 A1 | 4/2006 | Arai et al. |
| 2006/0085671 A1 | 4/2006 | Majni et al. |
| 2006/0136570 A1 | 6/2006 | Pandya |
| 2006/0136682 A1 | 6/2006 | Haridas et al. |
| 2006/0143365 A1 | 6/2006 | Kikuchi |
| 2006/0143475 A1 | 6/2006 | Herbert et al. |
| 2006/0156177 A1 | 7/2006 | Kottapalli et al. |
| 2006/0195650 A1 | 8/2006 | Su et al. |
| 2006/0253641 A1 | 11/2006 | Gatzemeier et al. |
| 2006/0256624 A1 | 11/2006 | Eggleston et al. |
| 2006/0259528 A1 | 11/2006 | Dussud et al. |
| 2006/0282644 A1 | 12/2006 | Wong |
| 2006/0294574 A1 | 12/2006 | Cha |
| 2007/0011413 A1 | 1/2007 | Nonaka et al. |
| 2007/0050536 A1 | 3/2007 | Kolokowsky |
| 2007/0058446 A1 | 3/2007 | Hwang et al. |
| 2007/0061511 A1 | 3/2007 | Faber |
| 2007/0061597 A1 | 3/2007 | Holtzman et al. |
| 2007/0067598 A1 | 3/2007 | Fujimoto |
| 2007/0076479 A1 | 4/2007 | Kim et al. |
| 2007/0079152 A1 | 4/2007 | Winick et al. |
| 2007/0081408 A1 | 4/2007 | Kwon et al. |
| 2007/0083697 A1 | 4/2007 | Birrell et al. |
| 2007/0083779 A1 | 4/2007 | Misaka et al. |
| 2007/0113019 A1 | 5/2007 | Beukema |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujbayashi et al. |
| 2007/0208901 A1 | 9/2007 | Purcell et al. |
| 2007/0226592 A1 | 9/2007 | Radke |
| 2007/0234004 A1 | 10/2007 | Oshima et al. |
| 2007/0234143 A1 | 10/2007 | Kim |
| 2007/0245061 A1 | 10/2007 | Harriman |
| 2007/0260811 A1 | 11/2007 | Merry, Jr. et al. |
| 2007/0263444 A1 | 11/2007 | Gorobets et al. |
| 2007/0276973 A1 | 11/2007 | Tan et al. |
| 2007/0277036 A1 | 11/2007 | Chamberlain et al. |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0028246 A1 | 1/2008 | Witham |
| 2008/0046630 A1 | 2/2008 | Lasser |
| 2008/0052446 A1 | 2/2008 | Lasser et al. |
| 2008/0077841 A1 | 3/2008 | Gonzalez et al. |
| 2008/0077937 A1 | 3/2008 | Shin et al. |
| 2008/0082736 A1 | 4/2008 | Chow et al. |
| 2008/0086677 A1 | 4/2008 | Yang et al. |
| 2008/0126720 A1 | 5/2008 | Danilak |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0183918 A1 | 7/2008 | Dhokia et al. |
| 2008/0189588 A1 | 8/2008 | Tanaka et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0263289 A1 | 10/2008 | Hosoya et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313505 A1 | 12/2008 | Lee et al. |
| 2009/0003058 A1 | 1/2009 | Kang |
| 2009/0006900 A1 | 1/2009 | Lastras-Montano et al. |
| 2009/0019321 A1 | 1/2009 | Radke |
| 2009/0037652 A1 | 2/2009 | Yu et al. |
| 2009/0070651 A1 | 3/2009 | Diggs et al. |
| 2009/0083587 A1 | 3/2009 | Ng et al. |
| 2009/0089485 A1 | 4/2009 | Yeh |
| 2009/0091990 A1 | 4/2009 | Park et al. |
| 2009/0109786 A1 | 4/2009 | Ye et al. |
| 2009/0125670 A1 | 5/2009 | Keays |
| 2009/0138654 A1 | 5/2009 | Sutardja |
| 2009/0144598 A1 | 6/2009 | Yoon et al. |
| 2009/0146721 A1 | 6/2009 | Kurooka et al. |
| 2009/0157948 A1 | 6/2009 | Trichina et al. |
| 2009/0164702 A1 | 6/2009 | Kern |
| 2009/0164710 A1 | 6/2009 | Choi et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |

(56) References Cited

U.S. PATENT DOCUMENTS

| | | |
|---|---|---|
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0179707 A1 | 7/2009 | Higashino |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228634 A1 | 9/2009 | Nakamura et al. |
| 2009/0228761 A1* | 9/2009 | Perlmutter ............ G06F 12/08 714/763 |
| 2009/0259819 A1 | 10/2009 | Chen et al. |
| 2009/0259896 A1 | 10/2009 | Hsu et al. |
| 2009/0271562 A1 | 10/2009 | Sinclair |
| 2009/0287975 A1 | 11/2009 | Kim et al. |
| 2009/0296466 A1 | 12/2009 | Kim et al. |
| 2009/0296486 A1 | 12/2009 | Kim et al. |
| 2009/0300238 A1 | 12/2009 | Panabaker et al. |
| 2009/0319864 A1 | 12/2009 | Shrader |
| 2009/0323419 A1 | 12/2009 | Lee et al. |
| 2009/0327581 A1 | 12/2009 | Coulson |
| 2009/0327591 A1 | 12/2009 | Moshayedi |
| 2010/0017650 A1 | 1/2010 | Chin et al. |
| 2010/0023674 A1 | 1/2010 | Aviles |
| 2010/0050053 A1 | 2/2010 | Wilson et al. |
| 2010/0061151 A1 | 3/2010 | Miwa et al. |
| 2010/0103737 A1 | 4/2010 | Park |
| 2010/0122019 A1 | 5/2010 | Flynn et al. |
| 2010/0128537 A1 | 5/2010 | Suhail et al. |
| 2010/0138592 A1 | 6/2010 | Cheon |
| 2010/0161936 A1 | 6/2010 | Royer et al. |
| 2010/0165689 A1 | 7/2010 | Rotbard et al. |
| 2010/0169541 A1 | 7/2010 | Freikorn |
| 2010/0172179 A1 | 7/2010 | Gorobets et al. |
| 2010/0174845 A1 | 7/2010 | Gorobets et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0217898 A1 | 8/2010 | Priborsky et al. |
| 2010/0217915 A1 | 8/2010 | O'Connor et al. |
| 2010/0223531 A1 | 9/2010 | Fukutomi et al. |
| 2010/0228928 A1 | 9/2010 | Asnaashari et al. |
| 2010/0262792 A1 | 10/2010 | Hetzler et al. |
| 2010/0262795 A1 | 10/2010 | Hetzler et al. |
| 2010/0262875 A1 | 10/2010 | Hetzler et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0287328 A1 | 11/2010 | Feldman et al. |
| 2010/0293367 A1 | 11/2010 | Berke et al. |
| 2010/0312954 A1 | 12/2010 | Jeon et al. |
| 2010/0318719 A1 | 12/2010 | Keays et al. |
| 2010/0332726 A1 | 12/2010 | Wang |
| 2011/0002224 A1 | 1/2011 | Tamura |
| 2011/0016239 A1 | 1/2011 | Stenfort |
| 2011/0055455 A1 | 3/2011 | Post et al. |
| 2011/0055468 A1 | 3/2011 | Gonzalez et al. |
| 2011/0066788 A1 | 3/2011 | Eleftheriou et al. |
| 2011/0072423 A1 | 3/2011 | Fukata |
| 2011/0078393 A1 | 3/2011 | Lin |
| 2011/0083060 A1 | 4/2011 | Sakurada et al. |
| 2011/0099342 A1 | 4/2011 | Ozdemir |
| 2011/0107144 A1 | 5/2011 | Ohara |
| 2011/0113281 A1 | 5/2011 | Zhang et al. |
| 2011/0131365 A1 | 6/2011 | Zhang et al. |
| 2011/0131444 A1 | 6/2011 | Buch et al. |
| 2011/0131447 A1 | 6/2011 | Prakash et al. |
| 2011/0132000 A1 | 6/2011 | Deane et al. |
| 2011/0138100 A1 | 6/2011 | Sinclair |
| 2011/0145473 A1 | 6/2011 | Maheshwari |
| 2011/0161775 A1* | 6/2011 | Weingarten ......... G06F 11/1048 714/755 |
| 2011/0173378 A1 | 7/2011 | Filor et al. |
| 2011/0190963 A1 | 8/2011 | Glassl et al. |
| 2011/0191522 A1 | 8/2011 | Condict et al. |
| 2011/0191649 A1 | 8/2011 | Lim et al. |
| 2011/0205823 A1 | 8/2011 | Hemink et al. |
| 2011/0209032 A1 | 8/2011 | Choi et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2011/0238892 A1 | 9/2011 | Tsai et al. |
| 2011/0239088 A1 | 9/2011 | Post |
| 2011/0258496 A1 | 10/2011 | Tseng et al. |
| 2011/0314219 A1 | 12/2011 | Ulrich et al. |
| 2011/0320687 A1 | 12/2011 | Belluomini et al. |
| 2012/0008401 A1 | 1/2012 | Katz et al. |
| 2012/0011336 A1 | 1/2012 | Saika |
| 2012/0047318 A1 | 2/2012 | Yoon et al. |
| 2012/0047320 A1 | 2/2012 | Yoo et al. |
| 2012/0047409 A1 | 2/2012 | Post et al. |
| 2012/0066450 A1 | 3/2012 | Yochai et al. |
| 2012/0079348 A1* | 3/2012 | Naeimi ............... G06F 11/1004 714/763 |
| 2012/0079355 A1* | 3/2012 | Patapoutian ........ G06F 11/1048 714/780 |
| 2012/0096217 A1 | 4/2012 | Son et al. |
| 2012/0110250 A1 | 5/2012 | Sabbag et al. |
| 2012/0124046 A1 | 5/2012 | Provenzano |
| 2012/0124273 A1 | 5/2012 | Goss et al. |
| 2012/0151253 A1 | 6/2012 | Horn |
| 2012/0151260 A1 | 6/2012 | Zimmermann et al. |
| 2012/0170365 A1 | 7/2012 | Kang et al. |
| 2012/0185706 A1 | 7/2012 | Sistla et al. |
| 2012/0195126 A1 | 8/2012 | Roohparvar |
| 2012/0213004 A1 | 8/2012 | Yun et al. |
| 2012/0216085 A1 | 8/2012 | Weingarten et al. |
| 2012/0236656 A1 | 9/2012 | Cometti |
| 2012/0239858 A1 | 9/2012 | Melik-Martirosian |
| 2012/0239976 A1 | 9/2012 | Cometti et al. |
| 2012/0240007 A1 | 9/2012 | Barndt et al. |
| 2012/0254686 A1 | 10/2012 | Esumi et al. |
| 2012/0266011 A1 | 10/2012 | Storer et al. |
| 2012/0266048 A1 | 10/2012 | Chung et al. |
| 2012/0278530 A1 | 11/2012 | Ebsen |
| 2012/0278531 A1 | 11/2012 | Horn |
| 2012/0284587 A1 | 11/2012 | Yu et al. |
| 2012/0297113 A1 | 11/2012 | Belluomini et al. |
| 2012/0311402 A1 | 12/2012 | Tseng et al. |
| 2012/0317334 A1* | 12/2012 | Suzuki ................. G06F 3/0608 711/103 |
| 2012/0324191 A1 | 12/2012 | Strange et al. |
| 2012/0331207 A1 | 12/2012 | Lassa et al. |
| 2013/0007380 A1 | 1/2013 | Seekins et al. |
| 2013/0007543 A1 | 1/2013 | Goss et al. |
| 2013/0054881 A1 | 2/2013 | Ellis et al. |
| 2013/0060994 A1 | 3/2013 | Higgins et al. |
| 2013/0061019 A1 | 3/2013 | Fitzpatrick et al. |
| 2013/0073788 A1 | 3/2013 | Post et al. |
| 2013/0080691 A1 | 3/2013 | Weingarten et al. |
| 2013/0094289 A1 | 4/2013 | Sridharan et al. |
| 2013/0100600 A1 | 4/2013 | Yin et al. |
| 2013/0104005 A1* | 4/2013 | Weingarten ......... G06F 11/1068 714/773 |
| 2013/0124792 A1 | 5/2013 | Melik-Martirosian et al. |
| 2013/0124945 A1 | 5/2013 | Hu et al. |
| 2013/0139035 A1 | 5/2013 | Zhong et al. |
| 2013/0151753 A1 | 6/2013 | Jeon et al. |
| 2013/0198436 A1 | 8/2013 | Bandic et al. |
| 2013/0232290 A1 | 9/2013 | Ish et al. |
| 2013/0238833 A1 | 9/2013 | Vogan et al. |
| 2013/0265825 A1 | 10/2013 | Lassa |
| 2013/0332791 A1 | 12/2013 | Chu |
| 2014/0036589 A1* | 2/2014 | Parthasarathy ...... G06F 11/1048 365/185.09 |
| 2014/0059359 A1 | 2/2014 | Bahirat |
| 2014/0108891 A1 | 4/2014 | Strasser et al. |
| 2014/0129874 A1 | 5/2014 | Zaltsman et al. |
| 2014/0158525 A1 | 6/2014 | Greene |
| 2014/0181370 A1 | 6/2014 | Cohen et al. |

(56) References Cited

U.S. PATENT DOCUMENTS

2014/0208174 A1 7/2014 Ellis et al.
2014/0372777 A1 12/2014 Reller et al.

FOREIGN PATENT DOCUMENTS

| | | |
|---|---|---|
| EP | 1 990 921 A2 | 11/2008 |
| EP | 2 498 259 A2 | 9/2012 |
| JP | 2002-532806 | 10/2002 |
| JP | 2012129859 A | 7/2012 |
| WO | WO 2007/036834 | 4/2007 |
| WO | WO 2007/080586 | 7/2007 |
| WO | WO 2008/121553 | 10/2008 |
| WO | WO 2008/121577 | 10/2008 |
| WO | WO 2009/028281 | 3/2009 |
| WO | WO 2009/032945 | 3/2009 |
| WO | WO 2009/042298 A1 | 4/2009 |
| WO | WO 2009/058140 | 5/2009 |
| WO | WO 2009/084724 | 7/2009 |
| WO | WO 2009/134576 | 11/2009 |
| WO | WO 2011/156466 A2 | 12/2011 |

OTHER PUBLICATIONS

International Search Report and Written Opinion dated Oct. 17, 2014, received in International Patent Application No. PCT/US2014/049734, which corresponds to U.S. Appl. No. 14/332,259, 8 pages (Higgins).
International Search Report and Written Opinion dated Oct. 23, 2014, received in International Patent Application No. PCT/US2014/049736, which corresponds to U.S. Appl. No. 14/446,249 8 pages (Fitzpatrick).
International Search Report and Written Opinion dated Nov. 5, 2014, received in International Patent Application No. PCT/US2014/049282, which corresponds to U.S. Appl. No. 13/957,407, 12 pages (Fitzpatrick).
Cooke, "Introduction to Flash Memory (T1A)," Flash Memory Summit, Aug. 22, 2008, Micron Technology, Inc., 102 pages.
Gal et al., "Algotithms and Data Structures for Flash Memories," ACM Computing Surveys, Jun. 2005, vol. 37, No. 2, 30 pages.
IBM Corporation, "Systems Management, Work Management," Version 5, Release 4, 9th Edition, Feb. 2006, pp. 1-21.
O'Brien, "SMART Storage Systems Optimus SAS Enterprise SSD Review," SMART Storage Systems, Oct. 9, 2012, 44 pages.
Spanjer, "Flash Management—Why and How?" Smart Modular Technologies, Nov. 2009, http://www.scantec.de/fileadmin/pdf/Smart_Modular/Flash-Management.pdf, 14 pages.
Texas Instruments, "Power Management IC for Digital Set Top Boxes," SLVSA10A, Sep. 2009, pp. 1-22.
International Search Report and Written Opinion dated Dec. 20, 2013, received in PCT/US2013/045282, which corresponds to U.S. Appl. No. 13/493,949, 7 pages (Ellis).
International Search Report and Written Opinion dated Jun. 12, 2014, received in PCT/US2014/018972, which corresponds to U.S. Appl. No. 13/779,352, 12 pages (Schmier).
International Search Report and Written Opinion dated May 14, 2014, received in International Patent Application No. PCT/US2014/017168, which corresponds to U.S. Appl. No. 14/076,115, 6 pages (Fitzpatrick).
International Search Report and Written Opinion dated May 14, 2014, received in International Patent Application No. PCT/US2014/017169, which corresponds to U.S. Appl. No. 14/076,148, 6 pages (Fitzpatrick).
Ulinktech, "ATA Command Table (in Alphabetic Order)," Feb. 6, 2011, https://web.archive.org/web/20110206060820/http://www.ulinktech.com/downloads/AT, 6 pages.
International Search Report and Written Opinion dated Aug. 22, 2014, received in International Patent Application No. PCT/US2014/032978, which corresponds to U.S. Appl. No. 14/081,992, 10 pages (Ellis).
International Search Report dated Mar. 25, 2014, received in International Patent Application No. PCT/US2013/072400, which corresponds to U.S. Appl. No. 13/690,337, 3 pages (Ellis).
Invitation to Pay Additional Fees dated Jul. 25, 2014, received in International Patent Application No. PCT/US2014/021290, which corresponds to U.S. Appl. No. 13/791,797, 8 pages (Dean).
International Search Report and Written Opinion dated Jul. 31, 2014, received in International Patent Application No. PCT/US2014/031465, which corresponds to U.S. Appl. No. 13/851,928, 13 pages (Ellis).
International Search Report and Written Opinion dated Jul. 31, 2014, received in International Patent Application No. PCT/US2014/033876, which corresponds to U.S. Appl. No. 13/861,326, 9 pages (Fitzpatrick).
Wang et al., "Soft Information for LDPC Decoding in Flash: Mutual-Information Optimized Quantization", 2011, pp. 1-6, IEEE.
Zhao et al., "LDPC-in-SSD: Making Advanced Error Correction Codes Work Effectively in Solid State Drives", 11th USENIX Conference on File and Storage Technologies (FAST '13), USENIX Association, pp. 243-256.
Barr, Introduction to Watchdog Timers, Oct. 2001, 3 pgs.
Canim, Buffered Bloom ilters on Solid State Storage, ADMS*10, Singapore, Sep. 13-17, 2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology-AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.

(56) References Cited

OTHER PUBLICATIONS

SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/U52012/059453, Jun. 6, 2013, 12 pgs.
SanDisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
Narayanan et al., "Migrating Server Storage to SSDs: Analysis of Tradeoffs," Computer Systems, Apr. 2009, 12 pages.
Shiraz et al., "Block Aging Prevention Technique (BAP) for Flash Based Solid State Disks," 7th International Conference on Emerging Technologies (ICET), Sep. 5, 2011, 6 pages.
Tai et al, "Prolongation of Lifetime and the Evaluation Method of Dependable SSD," 25 International Symposium on Defect and Fault Tolerance in VLSI Systems, 2010, NJ, USA, 8 pages.
Tseng et al., "Understanding the impact of Power Loss on Flash Memory," DAC'11, Jun. 5-10, 2011, San Diego, California, 6 pages.
Yimo et al., "WeLe-RAID: A SSD-Based RAID for System Endurance and Performance," Jan. 2011, Network and Parallel Computing, Springer, 14 pages.
International Search Report and Written Opinion dated Jan. 9, 2015, received in International Patent Application No. PCT/US2014/049731, which corresponds to U.S. Appl. No. 14/334,324, 9 pages (Fitzpatrick).
International Search Report and Written Opinion dated Feb. 18, 2015, received in International Patent Application No. PCT/US2014/065401, which corresponds to U.S. Appl. No. 14/082,031, 9 pages (Higgins).
International Search Report dated Apr. 15, 2014, received in International Patent Application No. PCT/US2013/078340, which corresponds to U.S. Appl. No. 13/746,542, 11 pages (Ellis).

\* cited by examiner

METHOD AND SYSTEM FOR IMPROVING DATA INTEGRITY IN NON-VOLATILE STORAGE

CROSS REFERENCE TO RELATED APPLICATION

This application claims the benefit of U.S. Provisional Patent Application Ser. No. 61/767,234 filed Feb. 20, 2013, which is incorporated herein by reference in its entirety.

TECHNICAL FIELD

The present invention relates generally to a non-volatile memory system, and more particularly to a method for improving data integrity including with accessing memory using soft information.

BACKGROUND ART

Recently, there has been a growing demand for memory storage devices using NAND Flash memory due to their attractive features such as low power consumption, high data throughput, and small size. The original NAND flash architecture was referred to as single level cell (SLC) since it would only store one bit per in each memory cell (a floating gate transistor). More recent devices can store multiple bits per cell and are referred to as multi-level cell (MLC) flash.

In a solid state drive (SSD), a common requirement is that the drive maintains constant performance throughout its life. Some measures of performance are the operating power, the read throughput, and the average latency. In practice, reliability of the information stored in the flash decreases due to several factors such as cell-to-cell interference, charge leakage, over programming and read/write disturbance. These effects will become more severe with the age of the flash and the number of stored bits per cell. To resolve these issues, error correction codes (ECC) have been used to ensure data integrity and reliable data storage throughout the life of flash memory cells. By applying ECC, additional error correction bits are sent along the original data bits to protect the user data from errors caused by the weak or failing flash memory cells. Unfortunately, the addition of the error correction bits can reduce usable capacity. The fixed structure of the error correction codes can unnecessarily burden the storage capacity when no correction is necessary but can be insufficient to correct the user data as the flash memory cells wear.

Thus, a need still remains for a non-volatile memory system with error correction that can provide enhanced performance and longevity of a non-volatile storage system. In view of the growing market in the personal computer and peripheral areas, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

The present disclosure provides a system and method of improving data integrity in a non-volatile memory system. In one implementation, improving data integrity can include accessing a non-volatile memory cell for retrieving hard data bits representing the user data. The non-volatile memory system generates soft information by capturing a reliability of the hard data bits without adding a capacity burden to the solid state drive. The non-volatile memory system calculates syndrome bits by applying a lossy compression to the soft information for minimizing the impact of error correction when it is needed. The non-volatile memory system then generates host data by executing a low density parity check (LDPC) iterative decode on the hard data bits and the syndrome bits for increasing the reliability of the user data without unnecessarily impacting capacity or performance.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
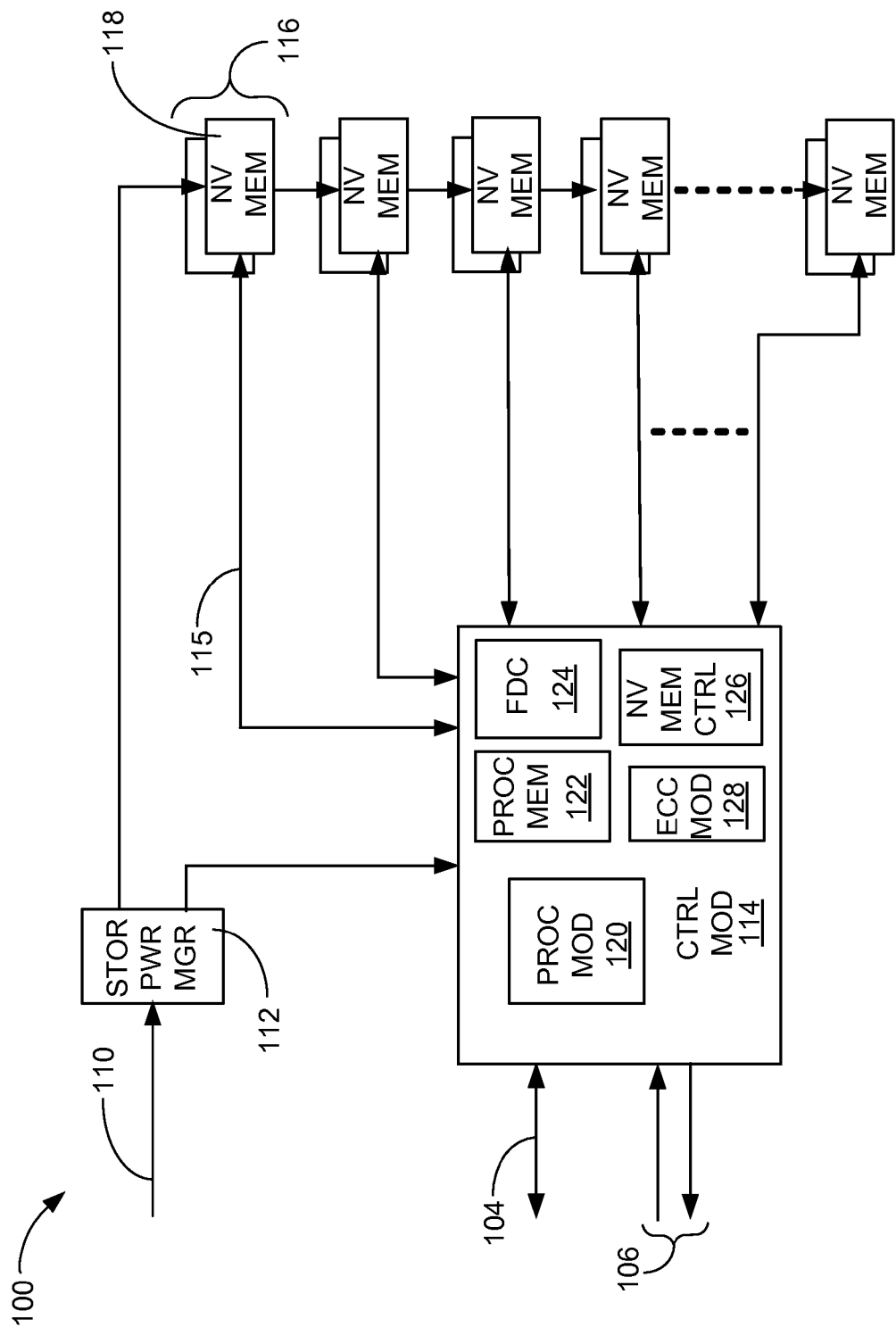
FIG. 1 is a block diagram of a non-volatile memory system with error correction mechanism in an embodiment of the present invention.

The following embodiments are described in sufficient detail to enable those skilled in the art to make and use the claimed invention. It is to be understood that other embodiments would be evident based on the present disclosure, and that system, process, or mechanical changes may be made without departing from the scope of the claimed invention.

In the following description, numerous specific details are given to provide a thorough understanding of the invention. However, it will be apparent that the invention may be practiced without these specific details. In order to simplify the disclosure, some well-known circuits, system configurations, and process steps are not disclosed in detail.

The drawings showing embodiments of the system may be drawn not to scale. Similarly, although the views in the drawings for ease of description generally show similar orientations, this depiction in the figures is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

Various embodiments described here include a new approach to improving data integrity in a non-volatile memory system. This approach includes a method including:

accessing a non-volatile memory cell for retrieving hard data bits; generating soft information by capturing a reliability of the hard data bits; calculating syndrome bits by applying a lossy compression to the soft information; and generating a host data by executing a low density parity check (LDPC) iterative decode on the hard data bits and the syndrome bits.

The present invention provides a non-volatile memory system, including: a non-volatile memory cell, coupled to a destination register, for retrieving hard data bits; a soft information module, coupled to the destination register, for capturing a reliability of the hard data bits; a lossy compression module, coupled to the soft information module, for calculating syndrome bits; and an error correction module, coupled to the lossy compression module, for generating a host data by executing a low density parity check (LDPC) iterative decode on the hard data bits and the syndrome bits.

Referring now to FIG. 1, therein is shown a block diagram of a non-volatile memory system 100 with error correction mechanism in an embodiment of the present invention. The block diagram of the non-volatile memory system 100 depicts a host data bus 104, a command interface 106, and a system power interface 110 coupled to a storage power manager 112.

The storage power manager 112 can provide operational power and alerts to a controller module 114 and an array 116 of a non-volatile memory device 118. The non-volatile memory device 118 can be NAND flash memory, single-level cell (SLC) flash memory, or multi-level cell (MLC) flash memory. The array 116 of the non-volatile memory device 118 can be coupled through a flash data bus 115 to the controller module 114. The controller module 114 can be a hardware module having a processor module 120, a processor memory module 122, a flash interface controller 124, a non-volatile memory controller 126, and an error correction module 128, such as a low density parity check (LDPC) decoder module.

The processor module 120 can perform maintenance and support tasks for the non-volatile memory system 100. The processor memory module 122 can be coupled to the processor module 120 to operate as data cache, temporary storage, instruction storage, and interface state memory.

The flash interface controller 124 is a hardware structure coupled between the flash data bus 115, and the error correction module 128. The flash interface controller 124 can manage the transfer of the hard data bits read from the non-volatile memory device 118. The hardware for the flash interface controller 124 can be a multiplexed structure that uses the flash data bus 115 to transfer the either the hard data bits read from the non-volatile memory device 118 or soft correction bits used by the error correction module 128.

Data written to the non-volatile memory device 118 can be randomized for either security reasons or for endurance and retention requirements. The resulting data is known to have high entropy, such as 50% 1's and 50% 0's. The number of data bits written at a value of 1 or 0 can be predicted. As the non-volatile memory device 118 ages a ratio of the number of 1's to 0's will change due to charge depletion in the non-volatile memory device 118. The charge depletion can occur due to the age of the data or an excessive number of reads of the data in the non-volatile memory device 118.

In normal operation, spurious data errors can be corrected by the error correction module 128 without re-reading the erroneous data blocks. As the charge is depleted with a given threshold voltage ($V_{th}$), the ratio of the number of 1's to 0's can change. As the number of bit errors increases, additional levels of the soft correction bits can be needed by the error correction module 128 to provide corrected data.

The processor module 120 can detect the increasing use of the error correction module 128. The processor module 120 can configure the flash interface controller 124 in order to invoke an increased number of the soft correction bits to the error correction module 128. The output of the flash interface controller 124 can steer the hard data bits to the error correction module 128 and the soft correction bits to additional logic to aid in the correction process.

It is understood that the activation of the flash interface controller 124 can be part of an error recovery process or as part of a continuous monitoring of the condition of the data within the non-volatile memory device 118. It is further understood that the adjustments of the threshold voltage ($V_{th}$) can be implemented to automatically apply to the non-volatile memory device 118 without intervention of the processor module 120.

It has been discovered that the flash data controller 124 can aid in the correction of the hard data read from the non-volatile memory device 118 while minimizing the use of additional power and latency. It has further been discovered that the flash interface controller 124 can quickly assist in the identification of suspect bits in the hard data read from the non-volatile memory device 118 while minimizing the utilization of additional power and latency.

Figure 2:
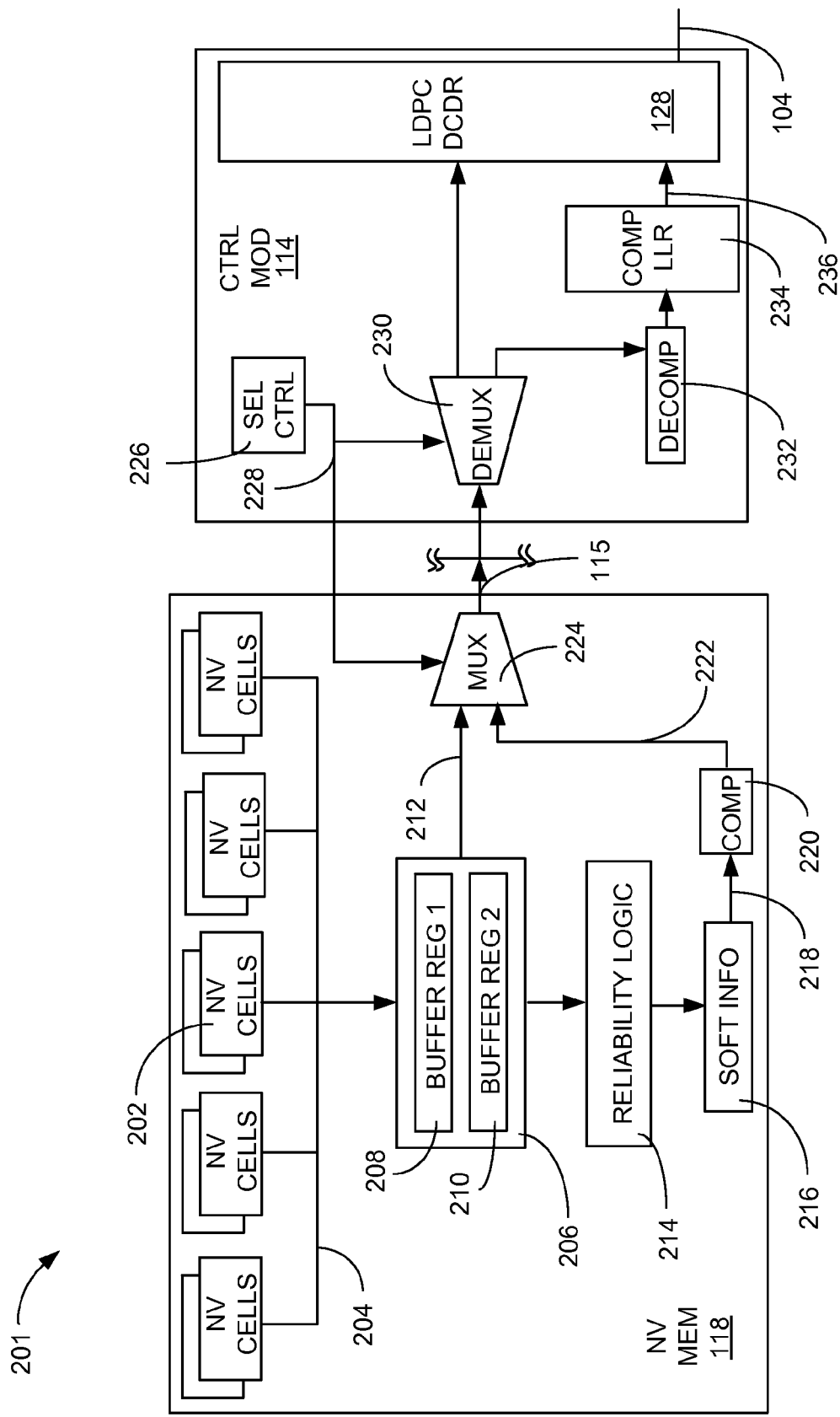
FIG. 2 is a detailed block diagram of an exemplary read path of the non-volatile memory system of FIG. 1.

Referring now to FIG. 2, therein is shown a detailed block diagram of an exemplary read path of the non-volatile memory system 100 of FIG. 1. The detailed block diagram of the exemplary read path 201 of the non-volatile memory system 100 depicts the non-volatile memory device 118 coupled to the controller module 114 by the flash data bus 115.

The non-volatile memory device 118 can include a number of non-volatile memory cells 202 coupled through a read bus 204 to a destination register 206. The destination register 206 can include a first read register 208 and a second read register 210. The first read register 208 and the second read register 210 can each receive the hard data bits from the read bus 204 at a different threshold voltage ($V_{TH}$) (not shown). The subsequent reads of the same data location using different levels of the threshold voltage can load the same data in the first read register 208 and the second read register 210 or it can cause some of the bits to change value. In the event none of the bits change, the reliability of all of the bits is known with high confidence.

An output of the destination register 206 can be hard data bits 212. If the confidence in all of the hard data bits 212 is high, the code word, represented by the hard data bits 212, can be correctly decoded by the error correction module 128 and the results are presented on the host data bus 104. It is understood that while the hard data bits 212 are shown as a single line, the number of the hard data bits 212, represented in a code word decoded by the error correction module 128, can be 8 bits, 16 bits, 32 bits, 64 bits or some other number of bits limited only by the design of the controller module 114 and the non-volatile memory device 118.

In the event the bit values in the first read register 208 and the second read register 210 are different, the individual bits that change value are suspect and can be flagged as having a probability of being the incorrect value as transferred in the hard data bits 212. A reliability logic module 214 can compare changes of the data bits from the first read register 208, loaded at a first threshold voltage ($V_{TH}$) and the second read register 210, loaded at a second threshold voltage ($V_{TH}$), based on the change in threshold voltage ($V_{TH}$) applied to the non-volatile memory cell 202. The reliability logic module 214 can be coupled to a soft information module 216 for generation of soft information 218 indicating the probability of the correctness of the hard data bits 212. The soft information module 216 can provide an offset pointer (not shown) for accessing selected portions of the soft information 218.

It is understood that the destination register 206 can have additional registers beyond the first read register 208 and the second read register 210 in order to capture additional information about the number of bits that change due to changes in the threshold voltage ($V_{TH}$). It is also understood that the reliability logic module 214 can be integrated into the destination register 206. The reliability logic module 214 is shown separately to clarify the function.

A lossy compression module 220 can perform a lossy compression of the soft information 218. The lossy compression module 220 can reduce the size of the soft information 218 by selecting a subset of the soft information 218 for transfer to the controller module 114. The lossy compression module 220 can reduce the transfer time and power required to convey the soft information 218 to the controller module 114. By way of an example, the lossy compression module can be structured to transfer only every $N^{th}$ bit of the soft information 218, which requires $(1/N)^{th}$ of the time to complete the transfer and $(1/N)^{th}$ of the energy that would be required to transfer all of the bits of the soft information 218.

The lossy compression module 220 can provide a syndrome bits 222 that reflects the lossy compression of the soft information 218. The syndrome bits 222 can be coupled to a multiplexer 224 for transferring the syndrome bits 222 across the flash data bus 115. A selection controller 226 can control the data select line 228 in order to switch the multiplexer between the hard data bits 212 and the syndrome bits 222. The output of the multiplexer 224 is the flash data bus 115, which is coupled to a demultiplexer 230 for steering the hard data bits 212 to the error correction module 128 and the syndrome bits 222 to a decompression module 232.

The selection controller 226 can maintain the selection of the hard data bits 212 until a code word is not correctly decoded. Upon detecting a decode error from the error correction module 128, the selection controller 226 can select the syndrome bits 222. The syndrome bits 222 is generated during the decode process of the error correction module 128 and is waiting for transmission when the selection controller 226 switches the data select line 228.

The decompression module 232 can perform an iterative cycle decompression of the syndrome bits 222. The decompression module 232 can accept a second transfer of the syndrome bits 222 without discarding the first transfer. A compute log likelihood ratio (LLR) module 234 can calculate the probability of an individual bit being in error. The compute LLR module 234 can be coupled to the error correction module 128 for aiding in the LDPC decode of the code word.

The compute LLR module 234 can calculate the probability that bits addressed by the decompression module 232 contain an incorrectly read bit. The compute LLR module 234 can be a hardware accelerator, combinational logic, a microprogrammed hardware sequencer, or other fast calculating combination. Probability bits 236, calculated by the compute LLR module 234, can be applied to the error correction module 128 for executing an LDPC iterative decode process of the code word represented by the hard data bits 212. Any of the bits that are not reflected in the probability bits 236 is assumed to be a valid bit. If a subsequent LDPC decode performed by the error correction module 128 is unsuccessful, additional sets of the syndrome bits 222 can be iteratively transferred to the decompression module 232, which will add them to the syndrome bits 222 previously transferred in order to provide additional of the probability bits 236 and increase the bit correction capability to the error correction module 128.

It has been discovered that the non-volatile memory system 100 of FIG. 1 can minimize the time and energy required to perform correction of the hard data bits 212 when the error correction module 128 is unable to correctly decode a code word. The minimization of the time and energy can be provided by the lossy compression module 220, which generates the syndrome bits 222 having a shorter length than the entire length of the soft information 218.

Figure 3:
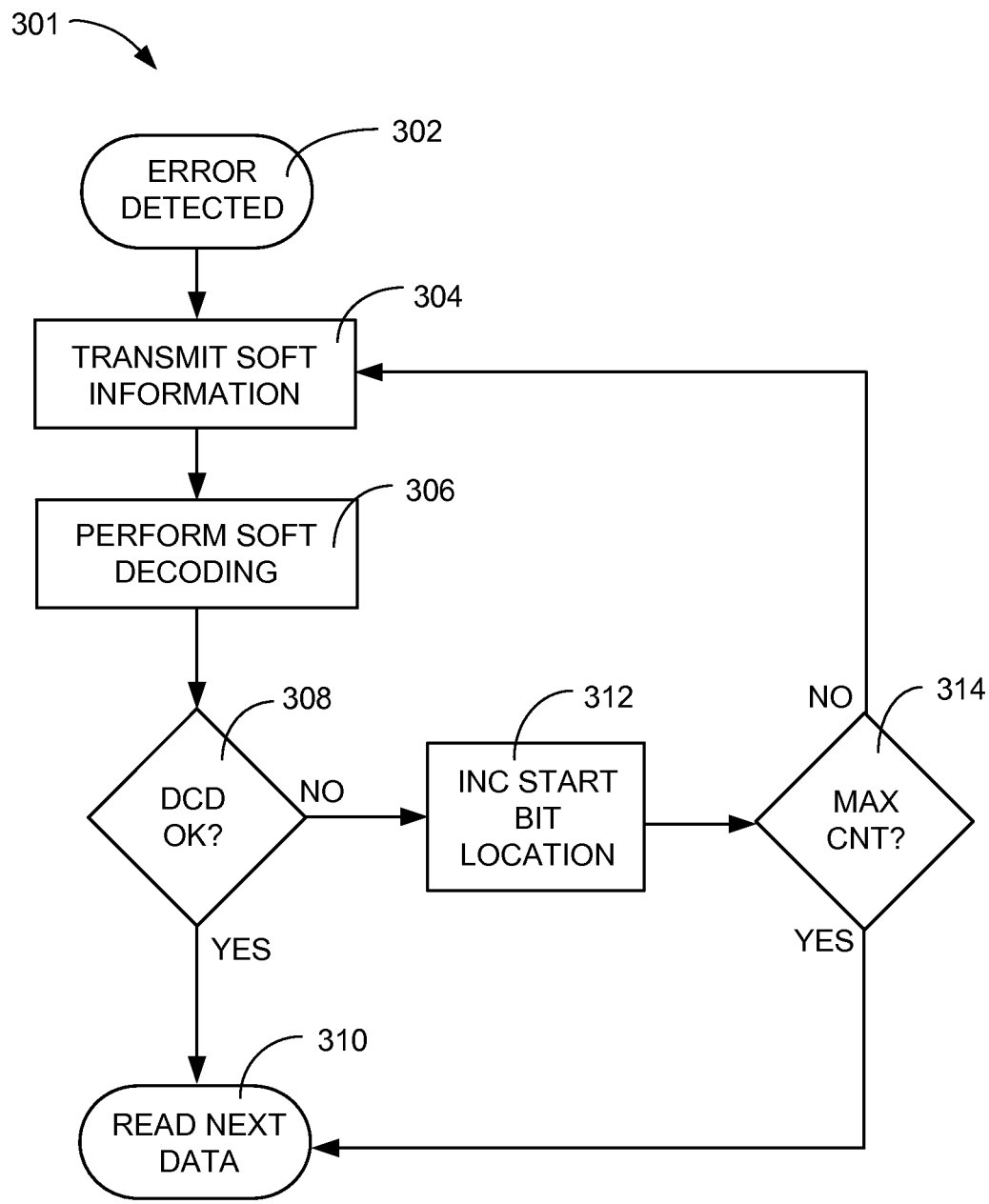
FIG. 3 is a control flow for a first embodiment of the non-volatile memory system of FIG. 1.

Referring now to FIG. 3, therein is shown a control flow 301 for a first embodiment of the non-volatile memory system 100 of FIG. 1. The control flow 301 for a first embodiment of the non-volatile memory system 100 depicts an error detected module 302 that indicates the hard data bits 212 of FIG. 2 were not decoded correctly by the error correction module 128 of FIG. 1. A modulus number N can be selected by the controller module 114 of FIG. 1 and configured into the lossy compression module 220 of FIG. 2. A start transfer bit K can be initialized to a zero value for the start of a correction process.

A transmit soft information module 304 will cause the selection controller 226 of FIG. 2 to switch the data select line 228 of FIG. 2 to allow the syndrome bits 222 of FIG. 2 onto the flash data bus 115 of FIG. 1 and into the decompression module 232 of FIG. 2. The lossy compression module 220 will transfer every $N^{th}$ bit starting with the $K^{th}$ bit. An initial transfer of the syndrome bits 222 of FIG. 2 will include bit 0, bit N, bit 2N, bit 3N, etc.

The syndrome bits 222 can be gated through the multiplexer 224 of FIG. 2, the flash data bus 115 and the demultiplexer 230 of FIG. 2 to the decompression module 232. The decompression module 232 can register the values of the syndrome bits 222 in a bit appropriate location for reconstructing the soft information 218 of FIG. 2. The decompression module 232 provides the registered bits to the calculate LLR module 234, which calculates the probability bits 236 for use in the LDPC decode process performed by the error correction module 128.

A perform soft decoding module 306 can signal the error correction module 128 to perform the iterative decoding of the code word represented by the hard data bits 212 and the probability bits 236. A check decode successful module 308 can determine whether the iterative soft decode yielded a valid code word. If the iterative soft decode was successful a read next data module 310 can be invoked. The read next data module 310 can switch the data select line 228 in order to gate the contents of the destination register 206 of FIG. 2, including the hard data bits 212.

If the check decode successful module 308 determines that the error correction module 128 was unsuccessful in the iterative soft decode, an increment start bit location module 312 can cause the lossy compression module 220 to index the starting bit location to K+1. This indexing would cause the syndrome bits 222 to represent bit 1, bit N+1, bit 2N+1, bit 3N+1, etc.

A maximum count check module 314 can determine whether the maximum number of the syndrome bits 222 has been transferred, or the iterative soft decoding has reached a programmatic maximum number of attempts. When the value of K is equal to N, all of the soft information 218 would have been transferred. If the maximum count check module 314 determines that the maximum count has not been reached, the transmit soft information module 304 can retrieve the next set of the syndrome bits 222 for another attempt of the iterative soft decode can be attempted. If the transmit soft information module 304 determines the maximum count has been reached, an error flag can be set in the controller module 114 and the read next data module 310 can be invoked to re-read the erroneous data as part of an error recovery process or it can increment the address in the non-volatile memory device 118 of FIG. 1 to read the next code word.

It has been discovered that transfer of the syndrome bits 222 from the lossy compression module 220 can correct the vast majority of the unsuccessful decode of the code word by the error correction module 118. Due to the monitoring and exchange of bad pages within the non-volatile memory cells 202, most of the data will be read with high reliability. As the non-volatile memory device 118 ages an increased number of single and double bit errors can be detected. The correction of these errors can be performed by the non-volatile memory system 100 while still utilizing less time and less energy than would be required by other error correction mechanisms.

By way of an example, with the value of N=4, every $4^{th}$ bit of the soft information 218 can be used to perform the iterative soft decode an example read of the hard data bits 212, the soft information 218, the syndrome bits 222 represented by every $4^{th}$ bit of the soft information 218.

process. A start transfer bit K can be initialized to a zero value for the start of a correction process.

The value of M represents a span of the hard data bits 212 that are reflected in the soft information 218 provided by the lossy compression module 220. The value of M must be greater than or equal to 2. The syndrome bits 222 can convey the minimum reliability across the span of M bits, the average reliability across the span of M bits, or the median value of the reliability across the span of M bits. Each of the different meanings of M would require a different LDPC decode strategy to be implemented. In this description, the syndrome bits 222 convey the minimum reliability across the span of M bits.

By way of an example, the soft information 218 can include 3 bits for each of the hard data bits 212. The most significant bit can indicate the value of the detected bit as either a 1 or a 0. The remaining two bits can indicate the confidence that the value of the detected bit is correct. The confidence bits can

TABLE 1 a value of 1 in the soft information means the bit is suspect

| Hard Data Bits:   | 1  | 0   | 1  | 1  | 0  | 0   | 0   | 1  | 0   | 1  | 1  | 1  | 0  | 1  | 0   | 1  | 0   |
|---|---|---|---|---|---|---|---|---|---|---|---|---|---|---|---|---|---|
| Soft Information  | 0  | 0   | 0  | 0  | 1  | 0   | 0   | 1  | 0   | 0  | 0  | 0  | 1  | 1  | 1   | 0  | 0   |
| Syndrome Bits     | 0  |     |    | 1  |    |     |     | 0  |     |    |    |    | 1  |    |     |    | 0   |
| LLR (all soft info) | 15 | −15 | 15 | 15 | −3 | −15 | −15 | 3  | −15 | 15 | 15 | 15 | −3 | 3  | −3  | 15 | −15 |
| LLR (X Soft info) | 15 | −11 | 11 | 11 | −3 | −11 | −11 | 11 | −15 | 11 | 11 | 11 | −3 | 11 | −11 | 11 | −15 |

The LLR values show the probability bits 236 value with all of the soft information 218 transferred. A value of 15 is a very confident 1 and a value of −15 is a very confident 0. The lower the absolute number of the probability the less confidence is conveyed. In the example the LLR for X of the soft information 218 has the correct values for the syndrome bits 222 that are available and the remaining bits are assumed to most likely be correct. As more of the syndrome bits 222 become available, more of the suspect bits will be identified and can be corrected. In the example above a LLR value of −3 represent values of 0-3, where a value of 3 indicates high confidence that the detected bit is correct and a value of 0 indicates low confidence.

By way of an example, with the value of M and N=4, every $4^{th}$ bit of the soft information 218 can represent the lowest confidence across the span of 4 bits, This information can be used to perform the iterative soft decode an example read of the hard data bits 212, the soft information 218, the syndrome bits 222 represented by every $4^{th}$ bit of the soft information 218.

TABLE 2

Each span of 4 bits of Soft information have the same numerical confidence as the lowest confidence in the span.

| Hard Data Bits:   | 1  | 0   | 1  | 1 | 0   | 0   | 0   | 1  | 0   | 1  | 1  | 1  | 0  | 1  | 0  | 1  | 0  |
|---|---|---|---|---|---|---|---|---|---|---|---|---|---|---|---|---|---|
| Soft Information  | 3  | 3   | 2  | 0 | 3   | 2   | 3   | 2  | 3   | 3  | 3  | 3  | 1  | 2  | 1  | 3  | 0  |
| Syndrome bits     | 0  |     |    |   | 2   |     |     |    | 3   |    |    |    | 1  |    |    |    | 0  |
| LLR (all soft info) | 15 | −15 | 11 | 1 | −15 | −11 | −15 | 11 | −15 | 15 | 15 | 15 | −5 | 11 | −5 | 15 | −1 |
| LLR (1/4 Soft info) | 1  | −1  | 1  | 1 | −11 | −11 | −11 | 11 | −15 | 15 | 15 | 15 | −5 | 5  | −5 | 5  | −1 | represents a weak 0 and a LLR value of 3 represents a weak 1. The error correction module 128 can iteratively reverse the value of the low confidence bits during the iterative soft decode process in order to correct the code word.

Figure 4:
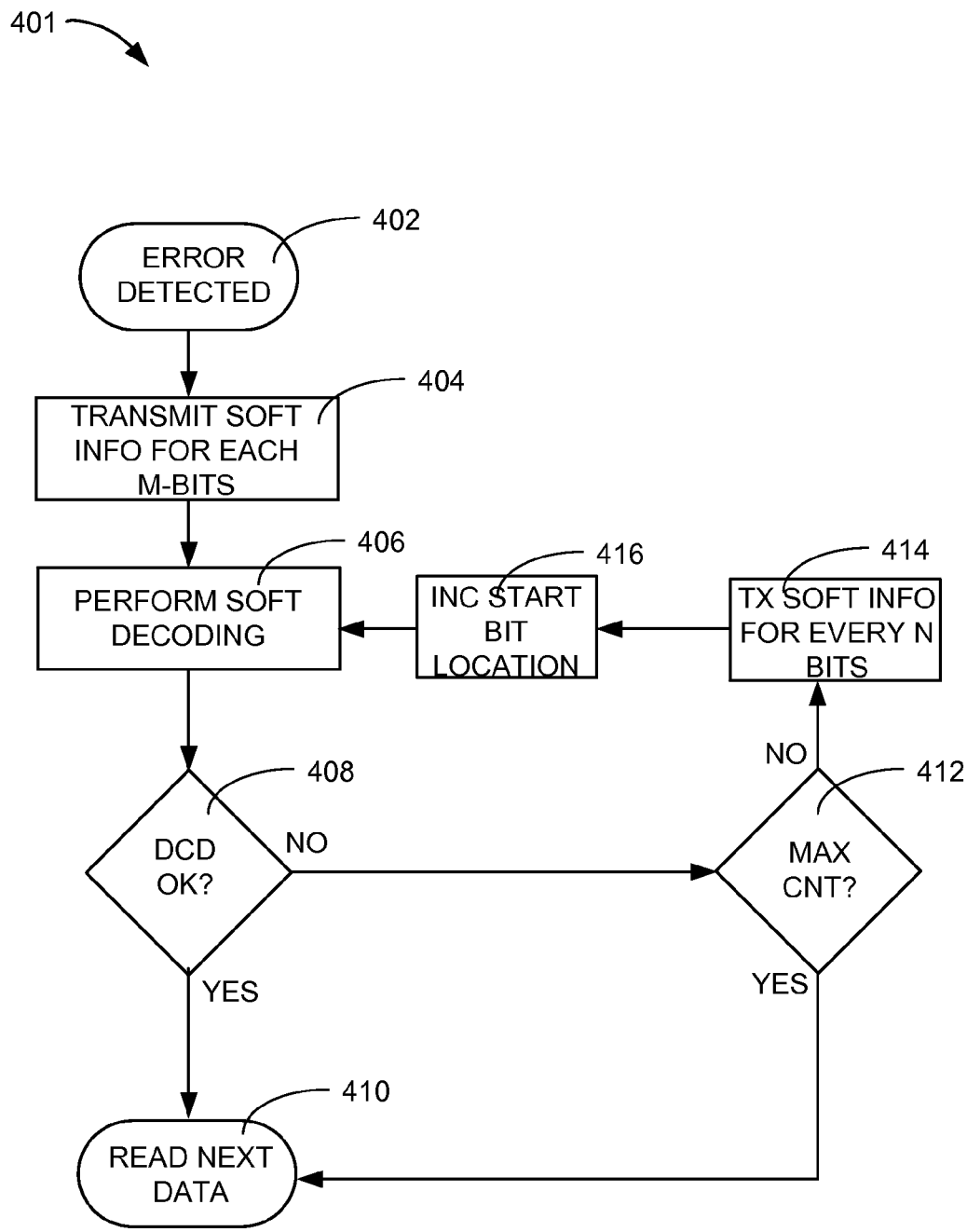
FIG. 4 is a control flow for a second embodiment of the non-volatile memory system of FIG. 1.

Referring now to FIG. 4, therein is shown a control flow 401 for a second embodiment of the non-volatile memory system 100 of FIG. 1. The control flow 401 depicts an error detected module 402 that indicates the hard data bits 212 of FIG. 2 were not decoded correctly by the error correction module 128 of FIG. 1. Modulus numbers M and N can be selected by the controller module 114 of FIG. 1 and configured into the lossy compression module 220 of FIG. 2. The value of M can be a span of bits that are referenced together by a single soft information value. The value of N can be a divisor of the code word that would determine the reduction in time and power for performing the iterative correction A transmit soft information span module 404 will cause the selection controller 226 of FIG. 2 to switch the data select line 228 of FIG. 2 to allow the syndrome bits 222 of FIG. 2 onto the flash data bus 115 of FIG. 1 and into the decompression module 232 of FIG. 2. The lossy compression module 220 will transfer the syndrome bits 222 for each of the spans M starting with the $K^{th}$ bit. An initial transfer of the syndrome bits 222 will include M1 covering bits 0 through M−1, M2 covering bits M through 2M−1, M3 covering 2M through 3M−1, etc.

A perform soft decoding module 406 can signal the error correction module 128 to perform the LDPC iterative decoding of the code word represented by the hard data bits 212 and the probability bits 236 of FIG. 2. A check decode successful module 408 can determine whether the iterative soft decode yielded a valid code word. If the iterative soft decode was successful a read next data module 410 can be invoked. The read next data module 410 can switch the data select line 228 in order to gate the contents of the destination register 206 of FIG. 2, including the hard data bits 212.

If the check decode successful module 408 determines that the error correction module 128 was unsuccessful in the iterative soft decode, a maximum count check module 412 can determine whether the maximum number of the syndrome bits 222 has been transferred, or the iterative soft decoding has reached a programmatic maximum number of attempts. When the value of K is equal to N, all of the soft information 218 would have been transferred. If the maximum count check module 412 determines that the maximum count has not been reached, a transmit soft information module 414 can retrieve a set of the syndrome bits 222 for another attempt of the iterative soft decode can occur. The transmit soft information module 414 will cause the selection controller 226 of FIG. 2 to switch the data select line 228 of FIG. 2 to allow the syndrome bits 222 of FIG. 2 onto the flash data bus 115 of FIG. 1 and into the decompression module 232 of FIG. 2. The lossy compression module 220 will transfer every $N^{th}$ bit starting with the $K^{th}$ bit. The transfer of the syndrome bits 222 of FIG. 2 will include bit 0, bit N, bit 2N, bit 3N, etc.

If the maximum count check module 412 determines that the maximum count has been reached, an error flag can be set in the controller module 114 of FIG. 1 and the read next data module 410 can be invoked to re-read the erroneous data as part of an error recovery process or it can increment the address in the non-volatile memory device 118 of FIG. 1 to read the next code word.

An increment start bit location module 416 can cause the lossy compression module 220 to index the starting bit location to K+1. This indexing would cause the syndrome bits 222 to represent bit 1, bit N+1, bit 2N+1, bit 3N+1, etc. in preparation for the next transfer of the syndrome bits 222. The error correction module 128 can gain an understanding of the distribution of the unreliable bit locations from the initial syndrome bits 222 covering the spans of M bits. When the additional syndrome bits 222 are added to the LDPC iterative decode process a quick clarification of the suspect bits can lead to a valid decode of the code word.

It has been discovered that the use of the syndrome bits 222 that reflect the lowest confidence in a span of the hard data bits 212 can allow the error correction module 128 to concentrate the LDPC iterative decode process on the spans that have the lowest confidence. Since most of the hard data bits 212 are highly reliable knowing which spans have suspected bits can resolve the decode without additional information. If additional information is needed to resolve the code word, the syndrome bits 222 can be transferred in order to complete the LDPC iterative decode process.

Figure 5:
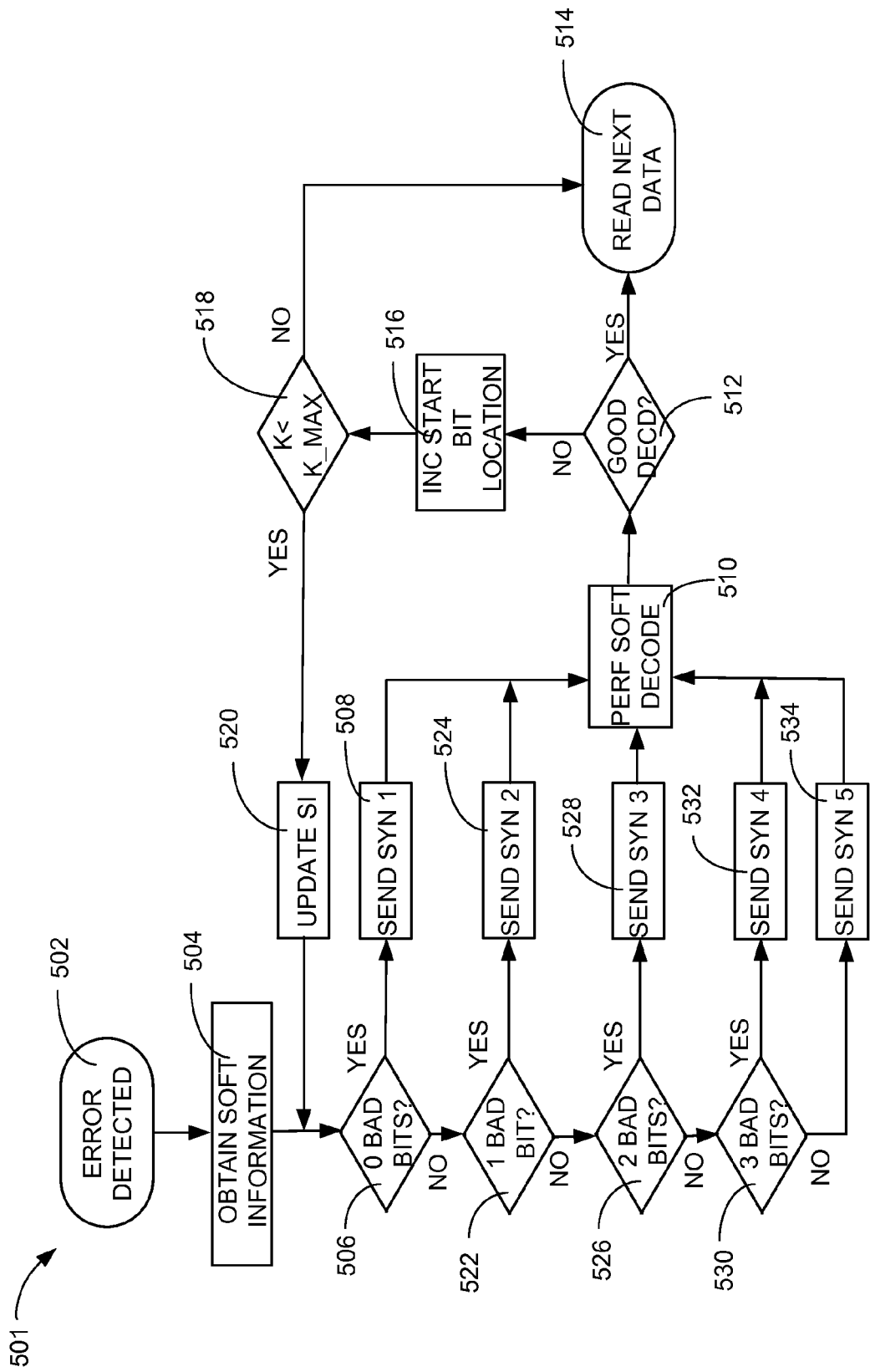
FIG. 5 is a control flow for a third embodiment of the non-volatile memory system of FIG. 1.

Referring now to FIG. 5, therein is shown a control flow 501 for a third embodiment of the non-volatile memory system 100 of FIG. 1. A variable rate code for sharing soft information between the non-volatile memory device 118 of FIG. 1 and the error correction module 128 of FIG. 1 can improve the efficiency of the LDPC iterative decode process. To be efficient, bit patterns that repeat frequently should be represented with short codes for the syndrome bits 222 of FIG. 2, and uncommon bit sequences can be represented with long codes for the syndrome bits 222 since they occur so infrequently.

TABLE 3

Sample code words with a probability of occurrence.

| N | 8 |
|---|---|
| Prob of Unreliable Bit | 0.01 |
| Prob of Reliable Bit | 0.99 |

| # Unreliable bits/N | Prob of Occur | Syndrome bits | Syn Length | (Pr of occ) * Length |
|---|---|---|---|---|
| 0 | 9.23E−01 | 0 | 1 | 9.23E−01 |
| 1 | 7.46E−02 | 10 | 2 | 1.49E−01 |
| 2 | 2.64E−03 | 110 | 3 | 7.91E−03 |
| 3 | 5.39E−05 | 1110 | 4 | 2.16E−04 |
| 4 or more | 6.78E−07 | 11110 | 5 | 3.39E−06 |
| | | Avg soft Bits/data bit | | 0.135 |

In table 3, the "Prob of Occur" indicates the probability of occurrence of the number of bits being suspect within the span designated by N=8 for this example. The error correction module 128 would have a very high probability in excess of 90% of being able to perform the LDPC iterative decode process without using the syndrome bits 222 at all. By implementing the variable length of the syndrome bits 222, the amount of time and energy used for correctly decoding the hard data bits 212 can be minimized.

The lossy compression module 220 can provide a variable length for the syndrome bits 222 per the values in table 3. The lossy compression module 220 can examine 8 of the bits of the soft information 218 at a time and construct the syndrome bits 222 to transfer in the lowest possible time and with the lowest possible energy utilized. With this strategy, each of the 8 bit spans in the code word can have the syndrome bits 222 terminated by a 0 value. By counting the preceding number of 1's in the syndrome bits 222, the error correction module 128 can know how many of the hard data bits 212 are possibly in error for each 8 bit span.

The control flow 501 depicts an error detected module 502 that indicates the hard data bits 212 of FIG. 2 were not decoded correctly by the error correction module 128 of FIG. 1. Modulus number N can be selected by the controller module 114 of FIG. 1 and configured into the lossy compression module 220 of FIG. 2. The value of N can be a span of bits that are referenced together by a single soft information value. A start transfer bit K can be initialized to a zero value for the start of a correction process.

A transmit soft information module 504 will cause the selection controller 226 of FIG. 2 to switch the data select line 228 of FIG. 2 to allow the syndrome bits 222 of FIG. 2 onto the flash data bus 115 of FIG. 1 and into the decompression module 232 of FIG. 2. The lossy compression module 220 will transfer an appropriate set of the syndrome bits 222 to match the number of the unreliable bits as listed in table 3.

The syndrome bits 222 can be gated through the multiplexer 224 of FIG. 2, the flash data bus 115 and the demultiplexer 230 of FIG. 2 to the decompression module 232. The decompression module 232 can register the values of the syndrome bits 222 in a bit appropriate location for reconstructing the soft information 218 of FIG. 2. The decompression module 232 provides the registered bits to the calculate LLR module 234, which calculates the probability bits 236 for use in the LDPC iterative decode process performed by the error correction module 128.

In order to clarify the description, it is assumed that the number of the hard data bits 212 is limited to 8 for this example. It is understood that the algorithm can be expanded to any bus width for the hard data bits 212.

A zero bad bits check 506 can verify whether there are no unreliable bits indicated in the soft information 218. If the zero bad bits check 506 determines that none of the hard data bits 212 are unreliable, a send syndrome 1 module 508 can transfer the syndrome bits 222 from table 3 to the decompression module 232.

A perform soft decode module 510 can trigger the error correction module 128 to perform the LDPC iterative decode process again. A successful decode check 512 can verify that the LDPC iterative decode process was successful. If the LDPC iterative decode process was successful, a read next data module 514 can switch the data select line 228 in order to gate the contents of the destination register 206 of FIG. 2, including the hard data bits 212 to access the next location in the non-volatile memory device 118.

If the successful decode check 512 verifies that the LDPC iterative decode process was not successful, an increment start bit location module 516 can increment K to K+1 in preparation for analyzing the soft information 218 again. A maximum count check module 518 can determine whether the maximum offset of K has been met. When the value of K is equal to K_MAX, all of the soft information 218 would have been transferred and the control flow can move to the read next data module 514. An error flag can be set in the controller module 114 and the read next data module 310 can be invoked to re-read the erroneous data as part of an error recovery process or it can increment the address in the non-volatile memory device 118 of FIG. 1 to read the next code word.

If the maximum count check module 518 can determine that the maximum offset of K has not been met, an update soft information module 520 can initiate multiple reads of the non-volatile memory cells 202 with the threshold voltage ($V_{TH}$) offset. The update soft information module 520 can reload the destination register 206 of FIG. 2 in an attempt to correctly capture the hard data bits 212. The control flow can then enter the zero bad bits check 506 for another attempt at determining the number of unreliable bits there are in the hard data bits 212.

The control flow 501 can sort the soft information within the lossy compression module 220. A one bad bit check 522 can look for a single unreliable bit in the hard data bits 212. If a single unreliable bit is determined, a send syndrome 2 module 524 can send the syndrome bits 222 equal to "10", from table 3, to the decompression module 232 and the flow can invoke the LDPC iterative decode process in the error correction module 128.

If the one bad bit check 522 does not find only the single bit to be unreliable, a two bad bit check 526 can look for two unreliable bits in the hard data bits 212. If two unreliable bits are determined, a send syndrome 3 module 528 can send the syndrome bits 222 equal to "110", from table 3, to the decompression module 232 and the flow can invoke the LDPC iterative decode process in the error correction module 128.

If the two bad bit check 526 does not find only two bits to be unreliable, a three bad bit check 530 can look for three unreliable bits in the hard data bits 212. If three unreliable bits are determined, a send syndrome 4 module 532 can send the syndrome bits 222 equal to "1110", from table 3, to the decompression module 232 and the flow can invoke the LDPC iterative decode process in the error correction module 128.

If the three bad bit check 530 does not find only three bits to be unreliable, a send syndrome 5 module 534 can send the syndrome bits 222 equal to "11110", from table 3, to the decompression module 232 and the flow can invoke the LDPC iterative decode process in the error correction module 128. The send syndrome 5 module 534 can indicate that there are four or more unreliable bits in the hard data bits 212.

By way of an example, a different variable length of the syndrome bits 222 can be defined, in contrast to the contents of table 3, to deliver a finer granularity in the designation of the location of the unreliable bits located in the hard data bits 212 in order to aid in the LDPC iterative decode process performed by the error correction module 128. A unique version of the syndrome bits 222 can be specified for groups of bits in the hard data bits 212. This approach can simplify the design of the error correction module 128 as well as speeding-up the LDPC iterative decode process. Since the vast majority of the hard data bits 212 are reliable, the infrequent occurrence of a transfer of the syndrome bits 222 maintains the goal of the non-volatile memory system 100 of FIG. 1 to reduce the time and energy required to correct the hard data bits 212 read from the non-volatile memory device 118. It is understood that syndrome bits 222 are only transferred if an error is detected by the error correction module 128.

An approach to provide additional detail of the location of the unreliable bits could be provided as shown in table 4 below.

TABLE 4

Finer granularity of unreliable bit location

| N | | | 8 | |
|---|---|---|---|---|
| Prob of Unreliable Bit | | | 0.01 | |
| Prob of Reliable Bit | | | 0.99 | |
| # Unreliable bits/N | Prob of Occur | Syndrome bits | Syn Length | (Pr of occ) * Length |
| 0 | 9.23E−01 | 0 | 1 | 9.23E−01 |
| 1 in bits 0-1 | 1.86E−02 | 10 | 2 | 3.73E−02 |
| 1 in bits 2-3 | 1.86E−02 | 110 | 3 | 5.59E−02 |
| 1 in bits 4-5 | 1.86E−02 | 1110 | 4 | 7.46E−02 |
| 1 in bits 6-7 | 1.86E−02 | 11110 | 5 | 9.32E−02 |
| 2 | 2.64E−03 | 111110 | 6 | 1.58E−02 |
| 3 | 5.39E−05 | 1111110 | 7 | 3.78E−04 |
| 4 or more | 6.78E−07 | 11111110 | 8 | 5.42E−06 |
| | | Avg soft Bits/data bit | | 0.150 |

By providing the finer granularity of the location of the unreliable bits in the hard data bits 212, the correction time and complexity of the LDPC iterative decode process can be reduced. The design of the compute LLR module 234 of FIG. 2 can also be simplified to provide a more accurate probability of the correction.

The designation of additional combinations of the syndrome bits 222 can be extended to include the likely location of two bits that are unreliable by extending the syndrome bits 222 to cover different bit combinations. This approach can be extended to increase the complexity of the syndrome bits 222 while further simplifying the error correction module 128 and the compute LLR module 232. By way of an implementation example without limiting the claimed invention, the lossy compression module 220 can use the soft information 218 to address a look-up table (not shown) that can be configured by the controller module 114 of FIG. 1 during initialization of the function to provide the syndrome bits 222.

An expansion of the syndrome bits 222 to cover two bit errors can be demonstrated by the additional codes shown in table 5 below:

TABLE 5

Syndrome bits containing detailed location information and two bit locations

| N | | | | 8 |
|---|---|---|---|---|
| Prob of Unreliable Bit | | | | 0.01 |
| Prob of Reliable Bit | | | | 0.99 |
| # Unreliable bits/N | Prob of Occur | Syndrome bits | Syn Length | (Pr of occ) * Length |
| 0 | 9.23E−01 | 0 | 1 | 9.23E−01 |
| 1 in bits 0-1 | 1.86E−02 | 10 | 2 | 3.73E−02 |
| 1 in bits 2-3 | 1.86E−02 | 110 | 3 | 5.59E−02 |
| 1 in bits 4-5 | 1.86E−02 | 1110 | 4 | 7.46E−02 |
| 1 in bits 6-7 | 1.86E−02 | 11110 | 5 | 9.32E−02 |
| 1 in bits 0-3, 1 in 4-7 | 1.51E−03 | 111110 | 6 | 9.04E−03 |
| 2 in bits 0-3 | 5.65E−04 | 1111110 | 7 | 3.95E−03 |
| 2 in bits 4-7 | 5.65E−04 | 11111110 | 8 | 4.52E−03 |
| 3 or more | 5.39E−05 | 111111110 | 9 | 4.85E−04 |
| 4 or more | 6.78E−07 | 1111111110 | 10 | 6.78E−06 |
| | | Avg Soft bits/data bit | | 0.150 |

More efficient codes, requiring more complex decoding and more complex encoding, can be constructed. An example of such codes is shown in Table 6. Note that while this code provides almost the same amount of information about the location of the erroneous bits as code 3, it results in fewer soft information bits per data bit. The syndrome bits 222 are constructed so that none codes of the syndrome bits 222 is part of the beginning of another of the codes of the syndrome bits 222. To decode the stream of the syndrome bits 222, the decoder counts the number of received bits until the received sequence is equivalent to one of the codes of the syndrome bits 222. As it can be seen in Table 6, the reduced soft information bit transfer rate comes at the price of more decoding complexity.

TABLE 6

More complex Syndrome bits patterns provide fewer soft information bits per data bit.

| N | | | | 8 |
|---|---|---|---|---|
| Prob of Unreliable Bit | | | | 0.01 |
| Prob of Reliable Bit | | | | 0.99 |
| # Unreliable Bits/CW | Prob of Occur | Syndrome bits | Syn Length | (Pr of occ) * Length |
| 0 | 9.23E−01 | 0 | 1 | 9.23E−01 |
| 1 in bits 0-1 | 1.86E−02 | 101 | 3 | 5.59E−02 |
| 1 in bits 2-3 | 1.86E−02 | 110 | 3 | 05.59E−02 |
| 1 in bits 4-5 | 1.86E−02 | 111 | 3 | 5.59E−02 |
| 1 in bits 6-7 | 1.86E−02 | 1000 | 4 | 7.46E−02 |
| 1 in bits 0-3 and 1 in bits 6-7 | 1.51E−08 | 10010 | 5 | 7.53E−03 |
| 2 in bits 0-3 | 5.65E−04 | 100111 | 6 | 3.39E−03 |
| 2 in bits 4-7 | 5.65E−04 | 1001100 | 7 | 3.95E−03 |
| 3 bits | 5.39E−05 | 10011010 | 8 | 4.26E−04 |
| 4 bits or more | 6.78E−07 | 10011011 | 8 | 5.53E−06 |
| Average soft bits/data bit | 0.1475 | | | |

It is understood that the tradeoff between encoder and decoder efficiency compared to bandwidth and energy efficiency is one that can be made between flash designers and LDPC decoder designers. As advances in semiconductor technology makes gates less expensive, it is likely that the transfer efficiency of the codes will become more important than simplicity of encoding and decoding.

By choosing longer codewords, such as N=10, or N=16, it is possible to create codes that are more efficient at the expense of having less accurate soft information. The loss of soft information accuracy causes the likelihood an uncorrectable sequence to increase. Ultimately, one can create more complex codes that convey more soft information to avoid increased probability of uncorrectable errors at the decoder output.

It has been discovered that the non-volatile memory system 100 can be configured to convey the syndrome bits 222 having a complexity that is suitable to the application requirements. In high reliability applications, more complex encoders and decoders can be used to convey increasingly accurate soft information to improve the reliability of the decoding process while minimizing the time and energy used during the LDPC iterative decode process. An approach to lessen the likelihood of the uncorrectable errors is to provide a programmable value of N allowing adjustment of the content of the syndrome bits 222 as necessary in the life cycle of the non-volatile memory system 100.

Figure 6:
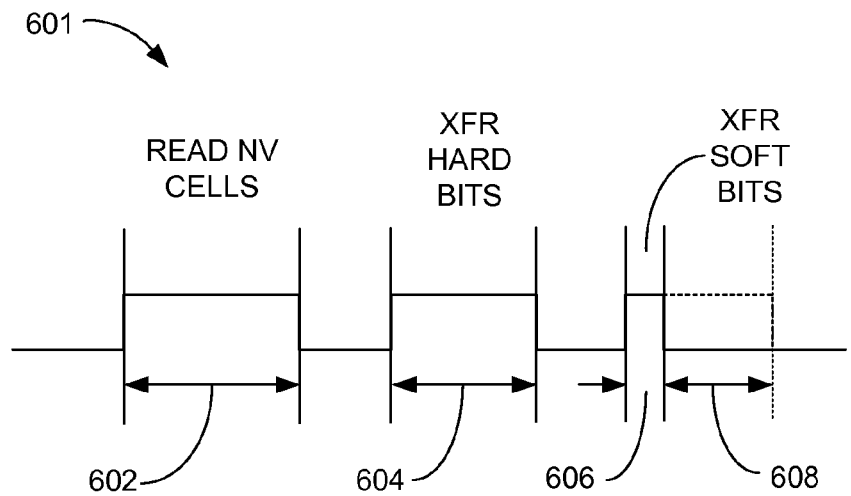
FIG. 6 is an exemplary timing diagram of the power used for data retrieval processes of the non-volatile memory system of FIG. 1.

Referring now to FIG. 6, therein is shown an exemplary timing diagram 601 of the power used for data retrieval processes of the non-volatile memory system 100 of FIG. 1. The exemplary timing diagram 601 depicts the power utilized by the non-volatile memory system 100 to retrieve the hard data bits 212 of FIG. 2 and perform the LDPC iterative decode process to correctly decode the host data 104 of FIG. 1. The read access 602, of the non-volatile memory cells 202 of FIG. 2, can take 40-60 microseconds for storing the contents of the non-volatile memory cells 202 in the first read register 208 of FIG. 2 and the second read register 210 of FIG. 2. During the read access 602 the reliability logic 214 of FIG. 2 can generate the soft information 218 of FIG. 2 and the syndrome bits 222 of FIG. 2. The transfer 604 of the hard data bits 212 of FIG. 2 can from the destination register 206 of FIG. 2 to the error correction module 128 of FIG. 1 can take 45 microseconds.

By utilizing the variable length of the syndrome bits 222, of the non-volatile memory system 100, the syndrome bits transfer 606 required for the LDPC iterative decode process can be between 6 and 10 micro-seconds. This can be favorably compared to the transfer of the total content of the soft information 218 which would take the same 45 microseconds of time and energy as the transfer 604 of the hard bits 212. An energy saving duration 608 can be between 35 and 39 microseconds. The efficiencies provided by the non-volatile memory system 100 can improve bandwidth and energy utilization while maintaining a robust error correction capability.

Figure 7:
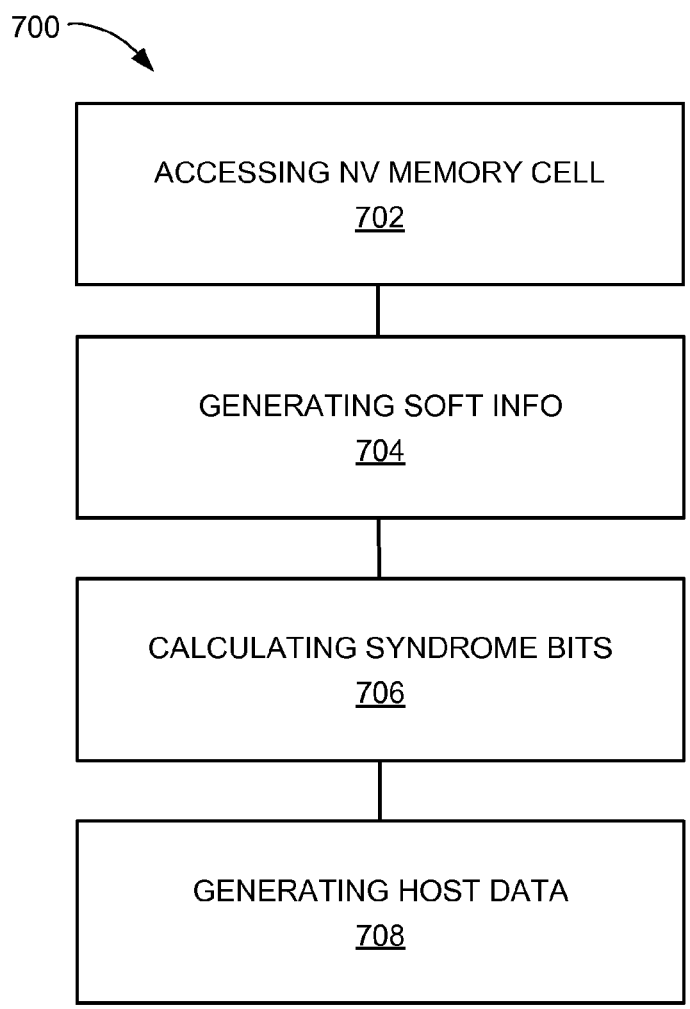
FIG. 7 is a flow chart of a method of operation of a non-volatile memory system in a further embodiment of the present invention.

Referring now to FIG. 7, therein is shown a flow chart of a method 700 of operation of a non-volatile memory system in a further embodiment of the present invention. The method 700 includes: accessing a non-volatile memory cell for retrieving hard data bits in a block 702; generating soft information by capturing a reliability of the hard data bits in a block 704; calculating syndrome bits by applying a lossy compression to the soft information in a block 706; and generating a host data by executing a low density parity check (LDPC) iterative decode on the hard data bits and the syndrome bits in a block 708.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for improving data integrity in a non-volatile memory system comprising:
    accessing non-volatile memory cells for retrieving hard data bits;
    decoding the hard data bits; and
    in response to a determination that decoding the hard data bits was not successful:
        generating soft information by capturing a reliability of the hard data bits, wherein generating the soft information includes loading a first read register with values of the hard data bits read using a first threshold voltage and loading a second read register, distinct from the first register, with values of the hard data bits read using a second threshold voltage, and comparing the contents of the first read register with the contents of the second read register;
        delivering the soft information and values from at least one of the first read register and second read register to an error correction module via a multiplexer;
        calculating syndrome bits by applying a lossy compression to the soft information; and
        generating host data by executing a low density parity check (LDPC) iterative decode on the hard data bits and the syndrome bits.

2. The method as claimed in claim 1 further comprising calculating probability bits from the syndrome bits.

3. The method as claimed in claim 1 wherein calculating the syndrome bits includes determining a number of unreliable bits and sending a syndrome 1 to a decompression module.

4. The method as claimed in claim 1 wherein executing the low density parity check (LDPC) iterative decode on the hard data bits and the syndrome bits includes calculating probability bits from the syndrome bits.

5. The method as claimed in claim 1 further comprising performing an iterative cycle decompression of the syndrome bits by transferring a second set of the syndrome bits.

6. A non-volatile memory system comprising:
    non-volatile memory cells, coupled to a destination register, for retrieving hard data bits, wherein the destination register includes a first read register, for loading hard data bits using a first threshold voltage, and a second read register, for loading values of the hard data bits read using a second threshold voltage;
    a reliability logic module, coupled to the destination register, for comparing the contents of the first read register with the contents of the second read register;
    a soft information module, coupled to the reliability logic module, for generating soft information by capturing a reliability of the hard data bits;
    a lossy compression module, coupled to the soft information module, for calculating syndrome bits by applying a lossy compression to the soft information;
    an error correction module, coupled to the lossy compression module, for generating host data by executing a low density parity check (LDPC) iterative decode on the hard data bits and the syndrome bits; and
    a multiplexer coupling at least one of the first read register and second read register to the error correction module;
    wherein the soft information module, lossy compression module and error correction module are configured to generate the soft information, calculate the syndrome bits and generate host data by executing the low density parity check iterative decode on the hard data bits and the syndrome bits in response to a determination that decoding the hard data bits was not successful.

7. The system as claimed in claim 6 further comprising a compute log likelihood ratio (LLR) module, coupled to the lossy compression module, for calculating probability bits from the syndrome bits.

8. The system as claimed in claim 6 wherein the lossy compression module, coupled to a multiplexer, is further for determining a number of unreliable bits and sending a syndrome to a decompression module.

9. The system as claimed in claim 6 wherein the error correction module, coupled to the lossy compression module, for generating host data includes a compute log likelihood ratio (LLR) module between the error correction module and the lossy compression module for calculating probability bits from the syndrome bits.

10. The system as claimed in claim 6 further comprising a decompression module configured to perform an iterative cycle decompression of the syndrome bits by transferring a second set of the syndrome bits having an incremented start location.

11. A non-volatile memory system comprising:
    a non-volatile memory device that includes:
        non-volatile memory cells having hard data bits;
        a destination register, coupled to the non-volatile memory cells, for retrieving the hard data bits, wherein the destination register includes a first read register, for loading hard data bits using a first threshold voltage, and a second read register, for loading values of the hard data bits read using a second threshold voltage;
        a reliability logic module, coupled to the destination register, for comparing the contents of the first read register with the contents of the second read register;
        a soft information module, coupled to the reliability logic module, for generating soft information by capturing a reliability of the hard data bits; and
        a lossy compression module, coupled to the soft information module, for calculating syndrome bits by applying a lossy compression to the soft information; and
    a controller module, coupled to the non-volatile memory device, the controller module including an error correction module for generating host data by executing a low density parity check (LDPC) iterative decode on the hard data bits and the syndrome bits;
    the non-volatile memory device further including a multiplexer coupling at least one of the first read register and second read register to the error correction module;
    wherein the soft information module, lossy compression module and error correction module are configured to generate the soft information, calculate the syndrome bits and generate host data by executing the low density parity check iterative decode on the hard data bits and the syndrome bits in response to a determination that decoding the hard data bits was not successful.

12. The system as claimed in claim 11 wherein the controller module further includes a compute log likelihood ratio (LLR) module for calculating probability bits from the syndrome bits.

13. The system as claimed in claim 11 wherein:
the non-volatile memory device having the lossy compression module, coupled to the soft information module, is further for determining a number of unreliable bits and sending a syndrome; and
the controller module further includes a decompression module for decompressing the syndrome.

14. The system as claimed in claim 11 wherein the controller module includes a compute log likelihood ratio (LLR) module for calculating probability bits, from the syndrome bits, for the error correction module.

15. The system as claimed in claim 11 wherein:
the non-volatile memory device includes:
a reliability logic module, coupled to the destination register, for calculating a soft information, and
a multiplexer, coupled to the lossy compression module and the destination register, for transferring the hard data bits and the syndrome bits on a flash data bus; and
the controller module includes a demultiplexer, coupled to the flash data bus, for separating the hard data bits and the syndrome bits from the flash data bus.

* * * * *